(12) United States Patent
Thambidurai et al.

(10) Patent No.: US 9,806,047 B2
(45) Date of Patent: Oct. 31, 2017

(54) WAFER LEVEL DEVICE AND METHOD WITH CANTILEVER PILLAR STRUCTURE

(71) Applicant: Maxim Integrated Products, Inc., San Jose, CA (US)

(72) Inventors: Karthik Thambidurai, Plano, TX (US); Peter R. Harper, Gilroy, CA (US); Sriram Muthukumar, Allen, TX (US); Arkadii V. Samoilov, Saratoga, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/492,576

(22) Filed: Sep. 22, 2014

(65) Prior Publication Data

US 2015/0279799 A1 Oct. 1, 2015

Related U.S. Application Data

(60) Provisional application No. 61/972,498, filed on Mar. 31, 2014.

(51) Int. Cl.
*H01L 23/00* (2006.01)
*H01L 21/78* (2006.01)

(52) U.S. Cl.
CPC .............. *H01L 24/14* (2013.01); *H01L 21/78* (2013.01); *H01L 24/03* (2013.01); *H01L 24/05* (2013.01);

(Continued)

(58) Field of Classification Search
CPC ......... H01L 24/14; H01L 24/94; H01L 21/78; H01L 24/11; H01L 2924/01029;

(Continued)

(56) References Cited

U.S. PATENT DOCUMENTS 6,414,849 B1 * 7/2002 Chiu .............................. 361/760
8,159,070 B2 * 4/2012 Lin et al. ....................... 257/758

(Continued)

OTHER PUBLICATIONS

Yota et al. ("Photodefinable Polybenzoxazole Interlevel Dielectric for GaAs HBT Applications" CS MANTECH Conference, Apr. 14-17, 2008).*

(Continued)

*Primary Examiner* — Marc Armand
*Assistant Examiner* — Sue Tang
(74) *Attorney, Agent, or Firm* — Advent, LLP

(57) ABSTRACT

A wafer level package, electronic device including the wafer level package, and fabrication methods are described that include forming a cantilever pillar design as a portion of the wafer level package and/or a segmented solder connection for preventing and reducing connection stress and increasing board level reliability. In implementations, the wafer level device that employs example techniques in accordance with the present disclosure includes at least a section of a processed semiconductor wafer including at least one integrated circuit die, a first dielectric layer disposed on the processed semiconductor wafer, a first pillar, a second pillar formed on the first pillar, a second dielectric layer formed on the first dielectric layer and surrounding a portion of the first pillar and the second pillar, and at least one solder ball disposed on the second pillar.

17 Claims, 6 Drawing Sheets

(52) U.S. Cl.
CPC .............. *H01L 24/06* (2013.01); *H01L 24/11* (2013.01); *H01L 24/13* (2013.01); *H01L 24/16* (2013.01); *H01L 24/81* (2013.01); *H01L 24/94* (2013.01); *H01L 2224/0345* (2013.01); *H01L 2224/0347* (2013.01); *H01L 2224/0391* (2013.01); *H01L 2224/03452* (2013.01); *H01L 2224/03462* (2013.01); *H01L 2224/03474* (2013.01); *H01L 2224/03903* (2013.01); *H01L 2224/0401* (2013.01); *H01L 2224/05024* (2013.01); *H01L 2224/05147* (2013.01); *H01L 2224/05541* (2013.01); *H01L 2224/05647* (2013.01); *H01L 2224/06131* (2013.01); *H01L 2224/06134* (2013.01); *H01L 2224/06177* (2013.01); *H01L 2224/11849* (2013.01); *H01L 2224/131* (2013.01); *H01L 2224/13015* (2013.01); *H01L 2224/13018* (2013.01); *H01L 2224/13028* (2013.01); *H01L 2224/13111* (2013.01); *H01L 2224/16106* (2013.01); *H01L 2224/16227* (2013.01); *H01L 2224/81815* (2013.01); *H01L 2224/94* (2013.01); *H01L 2924/014* (2013.01); *H01L 2924/0105* (2013.01); *H01L 2924/01028* (2013.01); *H01L 2924/01029* (2013.01); *H01L 2924/01047* (2013.01); *H01L 2924/181* (2013.01)

(58) Field of Classification Search
CPC ... H01L 2224/13015; H01L 2924/0105; H01L 2924/01028; H01L 2924/01047; H01L 2224/13018; H01L 2924/014
See application file for complete search history.

(56) References Cited

U.S. PATENT DOCUMENTS

| | | | | |
|---|---|---|---|---|
| 8,575,493 | B1* | 11/2013 | Xu | ............ H01L 24/13 174/255 |
| 8,643,150 | B1* | 2/2014 | Xu et al. | ............ 257/632 |
| 2003/0122240 | A1* | 7/2003 | Lin | ............ H01L 25/0657 257/686 |
| 2005/0233571 | A1* | 10/2005 | Tao | ............ H01L 21/563 438/614 |
| 2009/0072385 | A1* | 3/2009 | Alley et al. | ............ 257/713 |
| 2009/0130840 | A1* | 5/2009 | Wang et al. | ............ 438/614 |
| 2009/0146281 | A1* | 6/2009 | Jung | ............ 257/678 |

OTHER PUBLICATIONS

Tanaka et al. ("Improvement in Drop Shock Reliability of Sn—1.2Ag—0.5Cu BGA Interconnects by Ni Addition" IEEE 2006 Electronic Components and Technology Conference).*

* cited by examiner

WAFER LEVEL DEVICE AND METHOD WITH CANTILEVER PILLAR STRUCTURE

BACKGROUND

Flat no-lead packaging technologies, such as quad-flat no-leads (QFN) packaging technologies, physically and electrically connect integrated circuit chips to printed circuit boards. Flat no-lead packaging technologies typically employ a lead-frame that includes an integrated circuit chip (die) mounted thereon. The die may be electrically interconnected with the lead-frame through wire-bonding technology or flip-chip technology.

SUMMARY

A wafer level package, electronic device including the wafer level package, and fabrication methods are described that include forming a cantilever pillar design as a portion of the wafer level package and/or a segmented solder connection for preventing and reducing connection stress and increasing board level reliability. In implementations, the wafer level device that employs example techniques in accordance with the present disclosure includes at least a section of a processed semiconductor wafer including at least one integrated circuit die, a first dielectric layer disposed on the processed semiconductor wafer, a first pillar, a second pillar formed on the first pillar, a second dielectric layer formed on the first dielectric layer and surrounding a portion of the first pillar and the second pillar, and at least one solder ball disposed on the second pillar. Additionally, an electronic device can include a printed circuit board and a wafer level device coupled to the printed circuit board as described above. In implementations, one process for fabricating the wafer level package that employs example techniques in accordance with the present disclosure includes receiving a processed integrated circuit wafer; forming a first seed layer on the processed integrated circuit wafer; forming a first dielectric layer on at least a portion of the seed layer; forming a first pillar on a portion of the first seed layer; forming a second seed layer on the first pillar and the first dielectric layer; forming a second dielectric layer on a portion of the first dielectric layer; forming a second pillar on a portion of the second dielectric layer and the first pillar; removing the second dielectric layer; removing a portion of the second seed layer; and removing the first dielectric layer. The processed semiconductor wafer may be further processed and singulated.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1A:
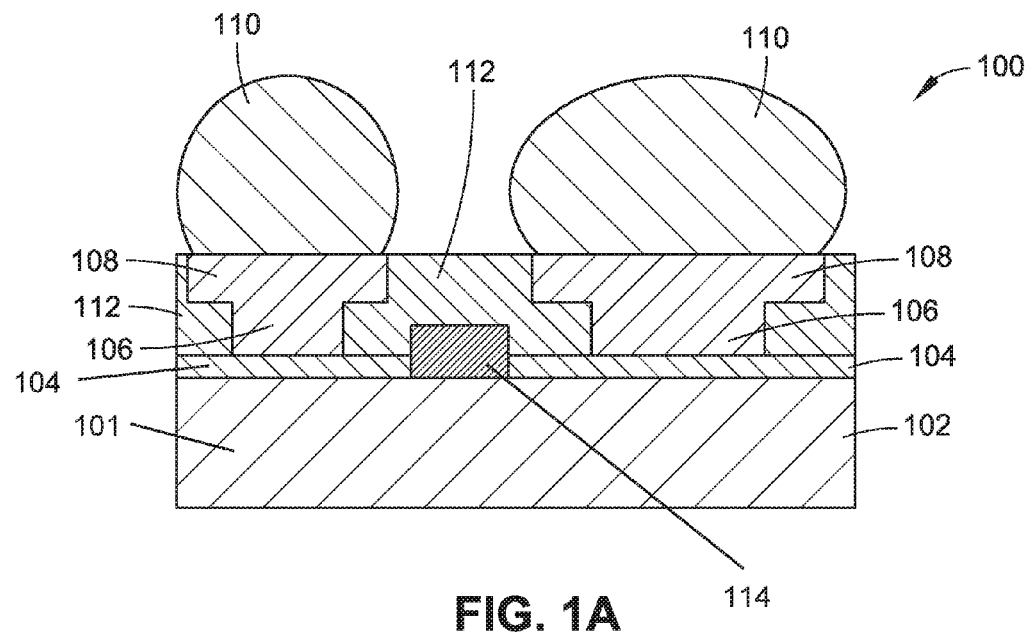
FIG. 1A is a diagrammatic cross-sectional side elevation view illustrating an embodiment of a wafer level package that includes a cantilevered pillar, in accordance with an example implementation of the present disclosure.

Wafer-level packaging is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

Devices that employ flat no-lead packaging technologies, such as QFN packaging technologies, provide good mechanical protection to the integrated circuit chips (dies) contained within the device packages by fully encapsulating the integrated circuit chips within the package. However, flat no-lead (e.g., QFN) package devices can be expensive to produce and typically provide relatively low pin counts (e.g., the pins of a QFN are typically located along the bottom edge). Compared to flat no-lead (QFN) packaging techniques, wafer-level packaging is generally less costly to implement since packaging occurs at wafer level, while flat no-lead packaging is performed at strip level. Sometimes, wafer-level QFN packages can have reliability issues. For example, a QFN package may have high wafer warpage due to a coefficient of thermal expansion (CTE) mismatch with copper. Additionally, board level reliability may be reduced due to the pad size. For high-power electronics, current solder standoff dimensions can create voids in the solder connection and/or unbalanced strain distribution.

Accordingly, a wafer level package, electronic device including the wafer level package, and fabrication methods are described that include forming a cantilever pillar design as a portion of the wafer level package and/or a segmented solder connection for preventing and reducing connection stress and increasing board level reliability. In implementations, the wafer level device that employs example techniques in accordance with the present disclosure includes at least a section of a processed semiconductor wafer including at least one integrated circuit die, a first dielectric layer disposed on the processed semiconductor wafer, a first pillar, a second pillar formed on the first pillar, a second dielectric layer formed on the first dielectric layer and surrounding a portion of the first pillar and the second pillar, and at least one solder ball disposed on the second pillar. Additionally, an electronic device can include a printed circuit board and a wafer level device coupled to the printed circuit board as described above. In implementations, one process for fabricating the wafer level package that employs example techniques in accordance with the present disclosure includes receiving a processed integrated circuit wafer; forming a first seed layer on the processed integrated circuit wafer; forming a first dielectric layer on at least a portion of the seed layer; forming a first pillar on a portion of the first seed layer; forming a second seed layer on the first pillar and the first dielectric layer; forming a second dielectric layer on a portion of the first dielectric layer; forming a second pillar on a portion of the second dielectric layer and the first pillar; removing the second dielectric layer; removing a portion of the second seed layer; and removing the first dielectric layer. The processed semiconductor wafer may be further processed and singulated.

Example Implementations

Figure 1B:
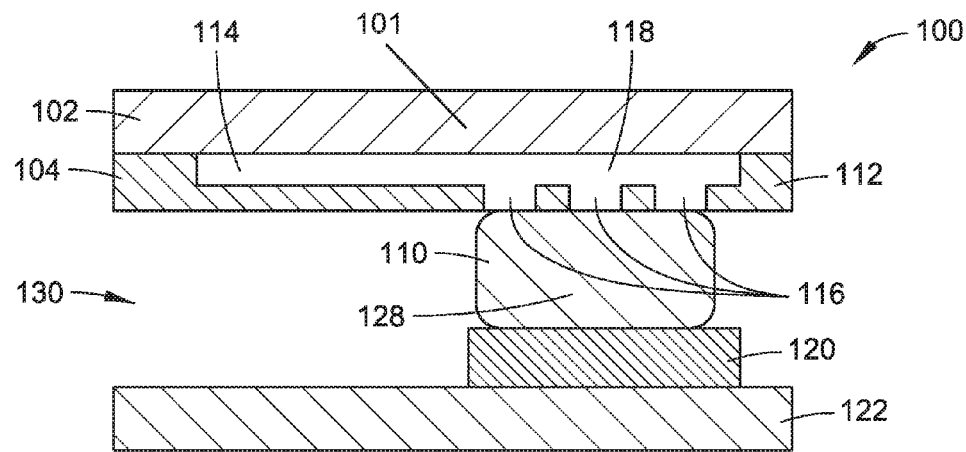
FIG. 1B is a diagrammatic cross-sectional side elevation view illustrating an embodiment of a wafer level package that includes a cantilevered pillar where the wafer level package is coupled to a printed circuit board, in accordance with an example implementation of the present disclosure.
Figure 1C:
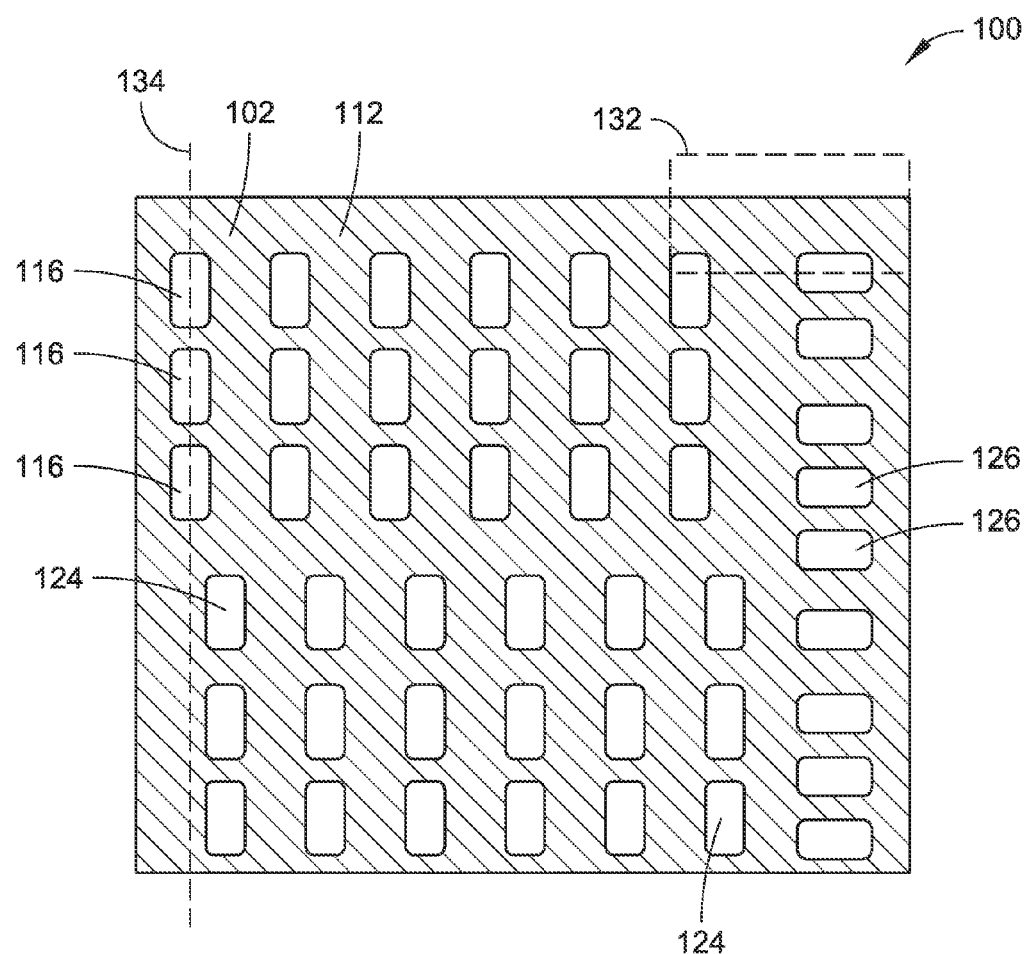
FIG. 1C is a plan view illustrating an embodiment of a wafer level package that includes a cantilevered pillar, in accordance with an example implementation of the present disclosure.

FIGS. 1A through 1C illustrate a wafer level package device 100 in accordance with an example implementation of the present disclosure. As shown in FIG. 1A, the wafer level package device 100 can include at least a section of a processed semiconductor wafer 101, where the processed semiconductor wafer 101 includes at least one integrated circuit device 102. In implementations, the integrated circuit device 102 can include at least one integrated circuit (e.g., an integrated circuit die) that has been formed from and/or as a portion of a processed semiconductor wafer 101. The integrated circuit device 102 may include digital integrated circuits, analog integrated circuits, mixed-signal circuits, and so forth. In one or more implementations, the integrated circuit device 102 may include digital logic devices, analog devices (e.g., amplifiers, etc.), and combinations thereof, etc.

As described above, the integrated circuit device 102 may be fabricated utilizing various fabrication techniques. For example, the integrated circuit device 102 may be fabricated via complimentary metal-oxide-semiconductor (CMOS) techniques, bi-polar semiconductor techniques, and so on. The integrated circuit device 102 may include electrical interconnections formed therein (e.g., integrated circuits, redistribution layers, vias, contact pads, etc.). In implementations, the integrated circuit device 102 can include an active die (e.g., a processor) and/or a passive die (e.g., a capacitor, a transistor, etc.). Additionally, the integrated circuit device 102 can include electrical interconnections (e.g., contacts pads, metal pads, such as copper and/or aluminum, under-ball metallization (UBM), etc.) configured to provide an electrical connection between the integrated circuit device 102 (by way of a redistribution layer, vias, and/or other electrical interconnections) and an external component (e.g., a printed circuit board).

The wafer level package device 100 includes a first dielectric layer 104. As shown in FIGS. 1A through 1C, first dielectric layer 104 is formed on at least a portion of the surface of a processed semiconductor wafer 101 with at least one integrated circuit device 102 formed therein. In some implementations, the first dielectric layer 104 may be formed on a seed layer, where the seed layer can be copper, for example. The dielectric layer 104 can include areas where the dielectric layer 104 is etched to expose the processed semiconductor wafer 101 and integrated circuit device 102 in order to later form another structure (e.g., a pillar) as is shown in FIG. 1B. In this embodiment, the dielectric layer 104 can be formed (e.g., by coating or deposition) on the processed semiconductor wafer 101 and integrated circuit device 102 and subsequently masked and/or etched to expose at least a portion of the integrated circuit device 102. The dielectric layer 104 can function as an electrical insulation between the integrated circuit device 102, first pillar 106, and other electrical devices. In implementations, the dielectric layer 104 can include, for example, a benzocyclobutene (BCB) polymer material, a polyimide (PI) material, a polybenzoxazole (PBO) material, an oxide material (e.g., silicon dioxide ($SiO2$)), and/or combinations thereof, etc. In one specific embodiment, the dielectric layer 104 can include polybenzoxazole (PBO). Additionally, the first dielectric layer 104 can be formed and/or applied in multiple sub-layers and/or multiple steps as needed.

A first pillar structure 106 can be disposed on a portion of the processed semiconductor wafer 101 and/or integrated circuit layer 102 that may have been exposed by etching at least a section of the first dielectric layer 104, as shown in FIGS. 1A through 1C. In implementations, the first pillar structure 106 can be formed on a portion of the processed semiconductor wafer 101 and integrated circuit layer 102 that has had a portion of the first dielectric layer 104 removed. In other implementations, the first pillar structure 106 can be formed on at least part of the first dielectric layer 104 and can be electrically connected to the integrated circuit device 102 using electrical interconnections (e.g., a redistribution layer, metal lines, etc.) where the electrical interconnections may be formed and/or disposed in the first dielectric layer 104. The first pillar structure 106 can include a structure that extends from the integrated circuit layer 102 and functions to create a standoff electrical connection from the integrated circuit layer 102. In some embodiments, the first pillar structure 106 can include electroplated copper or other conductive metal. It is contemplated that other electrically conductive materials can be utilized.

As shown in FIGS. 1A through 1C, a second pillar structure 108 is formed and disposed on the first pillar 106. In implementations, the second pillar 108 is configured to be cantilevered so that the second pillar structure 108 at least substantially overlaps the edges of the first pillar 106. In some embodiments, the second pillar structure 108 can form a cantilevered configuration on two sides. In other embodiments, the second pillar structure 108 can form a cantilevered configuration over three, four, or more sides of the first pillar structure 106. This cantilever configuration can function to provide a larger solderable surface while the first pillar 106 has a smaller footprint on the processed semiconductor wafer 101, which in turn can provide increased solderable surface area, yet require a samaller area for connection to the integrated circuit device 102. In embodiments, the second pillar 108 can include electroplated copper or other conductive metal. It is contemplated that other electrically conductive materials can be utilized.

As illustrated in FIGS. 1A through 1C, the wafer level package device 100 includes a second dielectric layer 112. The second dielectric layer 112 can be formed on the first dielectric layer 104 and surrounding at least a portion of the first pillar 106 and/or second pillar 108. In implementations, the second dielectric layer 112 can include a benzocyclobutene (BCB) polymer material, a polyimide (PI) material, a polybenzoxazole (PBO) material, an oxide material (e.g., silicon dioxide (SiO2)), and/or combinations thereof, etc. In other implementations, the second dielectric layer 112 can include plastic molding compounds which may further include composite materials such as, for example, epoxy resins, phenolic hardeners, silicas, catalysts, pigments, and mold release agents. In one specific embodiment, the second dielectric layer 112 can include an epoxy-based material. The second dielectric layer 112 can serve to electrically insulate and mechanically support and protect the first pillar 106 and the second pillar 108. Molding compounds used in this implementation may be selected to have a low moisture absorption rate, a high flexural strength at board-mounting temperatures, or a combination of both. Formation of the second dielectric layer 112 is described below.

A solder ball 110 can be formed on the surface of the second pillar 108. As shown in FIGS. 1A through 1C, the solder ball 110 can be formed and/or dropped on the exposed surface of the second pillar 108 in a segmented pad configuration. In implementations, the solder ball 110 can include materials that are suitable for soldering, for example lead-free metals such as a Tin-Silver-Copper (Sn—Ag—Cu) alloy (i.e., SAC), a Tin-Silver (Sn—Ag) alloy, a Tin-Copper (Sn—Cu) alloy, etc. In a specific embodiment, LF35 solder can be utilized as the solder ball 110 and for solder connections. LF35 can include a solder having a composition of about 0.05% Ni, 0.5% Cu, 1.2% Ag, and about 98.25% Sn. In some embodiments, multiple solder balls 100 disposed proximate to each other can form a solder joint 118 array, as illustrated in FIG. 1B. The solder joint array 118 can include multiple solder segments 116, where each segment 116 can be coupled to at least a portion of the same second pillar 108. Each exposed segment 116 can be isolated on the surface of the second dielectric layer 112 while remaining connected to the same first pillar 106. In one specific embodiment, each solder ball 110 can measure approximately 300 μm. Other embodiments can include solder balls with different dimensions. In some specific implementations, each segment 116 can be approximately 100 μm from the next segment. It is contemplated that other distances can be used (e.g., 150 μm, 50 μm, etc.). Utilizing the segment configuration illustrated in FIGS. 1A through 1C can result in a solder joint 118 with a greater standoff that gives the solder joint 118 greater strength. In a specific embodiment, a solder joint 118 is approximately 210 μm. FIG. 1A illustrates the cantilever configuration of the second pillar structure 108 in a side length view (cross-section of box 132), while FIG. 1B illustrates the cantilever configuration in a side width view along line 134 (a 90° rotation from the side length view).

FIG. 1B illustrates a side (width) elevation view of a wafer level package device 100 coupled with a printed circuit board 122. This view illustrates a side (width) of the wafer level package device 100 adjacent (a 90° rotation) to that shown in FIG. 1A. In this view, a redistribution layer structure 114 is shown, where multiple (three in the embodiment shown) first pillars 106 and corresponding second pillars 108 are formed on the redistribution layer structure 114 and form segments 116. Multiple segments 116 can be combined to form a single solder joint 118. Multiple solder balls 110 formed on multiple second pillars 108, after a reflow process, can merge and form a solder bar 128 effectively forming an electrical connection between the redistribution layer structure 114 and multiple second pillars 108 while increasing solder joint standoff, decreasing stress to the joints, and increasing board level reliability. The multiple solder balls 110 and/or solder bar 128 can be coupled to a contact pad 120 disposed on printed circuit board 122 to form an electronic device 130.

FIG. 1C illustrates a plan view of a surface of the wafer level package device 100 illustrated in FIG. 1A where an exemplary array of segments 116 is shown. As shown in FIG. 1C, the bottom surface of the wafer level package device 100 can include an exemplary array of power connections 124 and an array of control pins 126. These power connections 124 and control pins 126 can include the solder bar 128 formed from the multiple solder balls 110, as described above.

Example Processes

Figure 2:
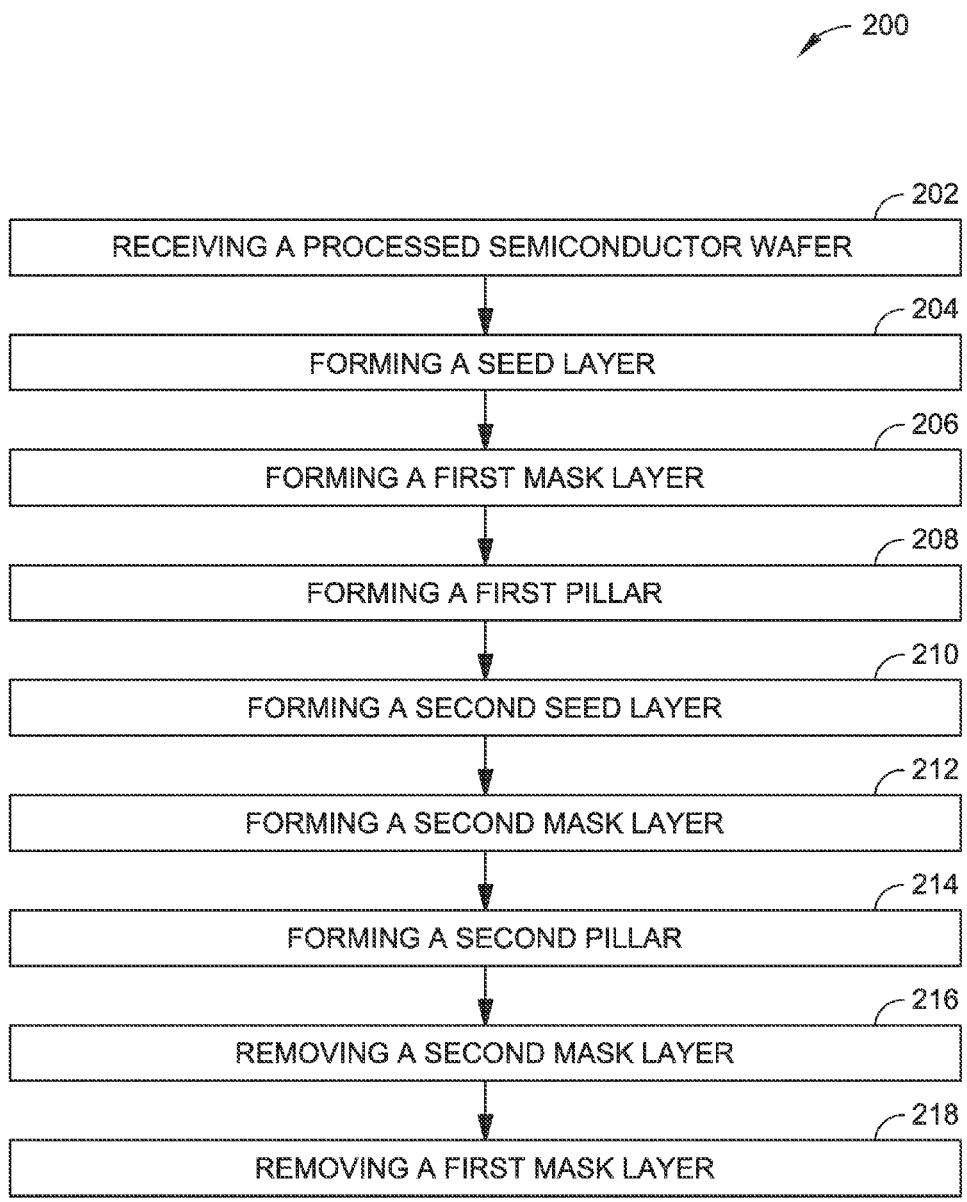
FIG. 2 is a flow diagram illustrating an example process for fabricating a wafer level package that includes a cantilevered pillar, such as the wafer level package illustrated in FIGS. 1A through 1C.

FIG. 2 illustrates an example process 200 that employs a wafer level package device, such as the wafer level package device 100 shown in FIGS. 1A through 1C. FIGS. 3A through 3H illustrate sections 300 of example integrated circuit device 102 that are utilized to fabricate semiconductor devices (such as wafer level package devices 100).

Figure 3A:
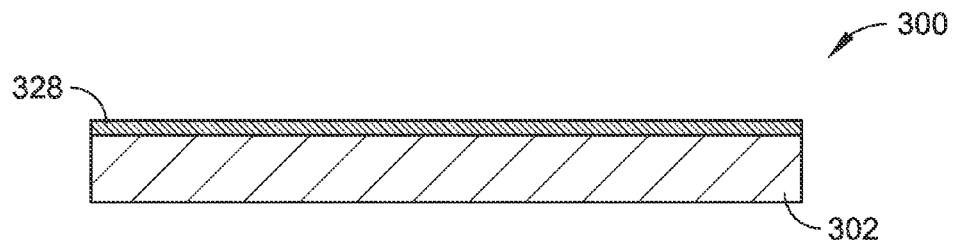
FIG. 3A is a diagrammatic partial cross-sectional side elevation view illustrating the fabrication of a wafer level package, such as the device shown in FIGS. 1A through 1C, in accordance with the process shown in FIG. 2.

In the process 200 illustrated, a processed semiconductor wafer and integrated circuit die are received (Block 202). As shown in FIG. 3A, receiving a processed semiconductor wafer 301 can include receiving a semiconductor wafer that has been processed to form one or more integrated circuits (e.g., a first integrated circuit device 302, a second integrated circuit die package, etc.). Additionally, the processed semiconductor wafer 301 can include a redistribution layer structure 314 and/or other electrical interconnections (e.g., under bump metallization, vias, metal lines, etc.) formed therein. Forming the integrated circuit device 302 and electrical connections can include using front-end-of-line (FEOL) fabrication processes, and some back-end-of-line (BEOL) processes, such as at least one suitable deposition technique (e.g., physical vapor deposition, chemical vapor deposition, molecular beam epitaxy, electroplating, etc.), etching, lithography, etc.

A first seed layer is formed on the processed semiconductor wafer and integrated circuit device (Block 204). In implementations, forming the first seed layer 328 can include forming and/or depositing the first seed layer 328 on the processed semiconductor wafer 301 and integrated circuit device 302. Suitable forming and/or deposition processes can include physical vapor deposition, chemical vapor deposition, and/or electroplating, etc. In one specific embodiment, forming the first seed layer 328 can include sputtering a layer of copper on the surface of the processed semiconductor wafer 301. It is contemplated that other materials may form the first seed layer 328.

Figure 3B:
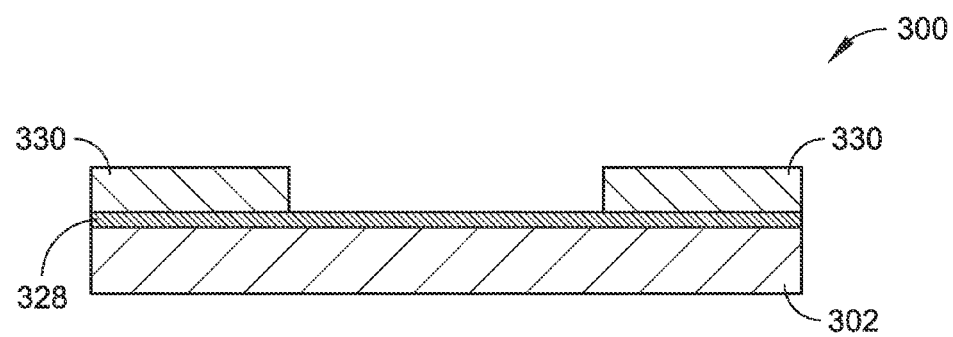
FIG. 3B is a diagrammatic partial cross-sectional side elevation view illustrating the fabrication of a wafer level package, such as the device shown in FIGS. 1A through 1C, in accordance with the process shown in FIG. 2.

As shown in FIG. 3B, a first mask layer is formed on the surface of the processed semiconductor wafer and first seed layer (Block 206). In implementations, forming the first mask layer 330 can include depositing and/or forming the first mask layer 330 over the first seed layer 328 on the surface of the processed semiconductor wafer 301 and the integrated circuit device 302. The first mask layer 330 may be formed and/or deposited over the first seed layer 328 through one or more suitable deposition techniques, such as those discussed above. In a specific embodiment, the first mask layer 330 can be coated on the first seed layer 328 using a spin coating process. In another specific embodiment, the first mask layer 330 can be deposited using chemical vapor deposition. After a deposition process, the first mask layer 330 can be etched and/or exposed to at least partially expose the first seed layer 328. In implementations, forming the first mask layer 330 may include depositing a suitable mask material, for example a dielectric material (e.g., benzocyclobutene polymer (BCB), polyimide (PI), polybenzoxazole (PBO), silicon dioxide (SiO2), and/or a nitride-based mask, etc.). In one specific embodiment, forming the first mask layer 330 includes depositing a nitride mask using chemical vapor deposition. Forming the first mask layer 330 can include using lithography and/or etching the first dielectric layer 310 to expose a portion of the integrated circuit device 302 and/or corresponding electrical interconnection (e.g., a redistribution layer structure) for forming a first pillar structure 306.

Figure 3C:
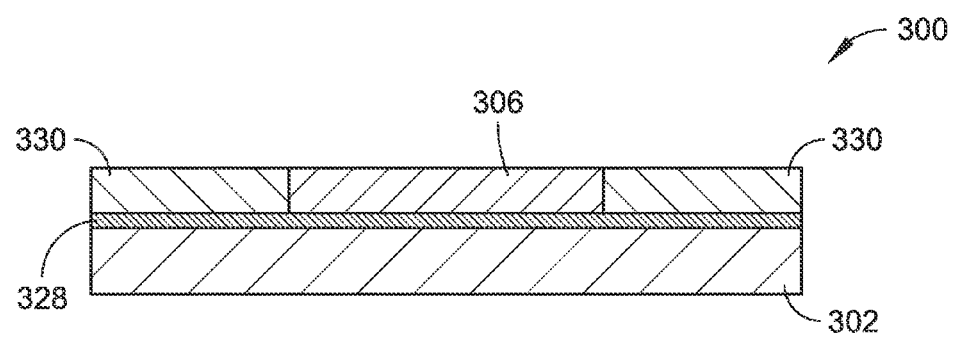
FIG. 3C is a diagrammatic partial cross-sectional side elevation view illustrating the fabrication of a wafer level package, such as the device shown in FIGS. 1A through 1C, in accordance with the process shown in FIG. 2.

Next, a first pillar structure is formed on the first seed layer and integrated circuit device (Block 208). In some implementations, forming the first pillar structure 306 can include forming via a suitable copper plating process. In one embodiment, forming the first pillar structure 306 includes forming a copper seed and electroplating the copper seed to a desired pillar thickness in an etched portion of the first mask layer 330. The size, shape, and dimensions of the first pillar structure 306 may vary according to the various design/fabrication considerations of the wafer-level package device 100. In one embodiment and as shown in FIG. 3C, the first pillar 306 may be formed using an electroplating process, where the first pillar 306 is formed on the copper seed layer exposed by the etched portion of the first mask layer 330.

Figure 3D:
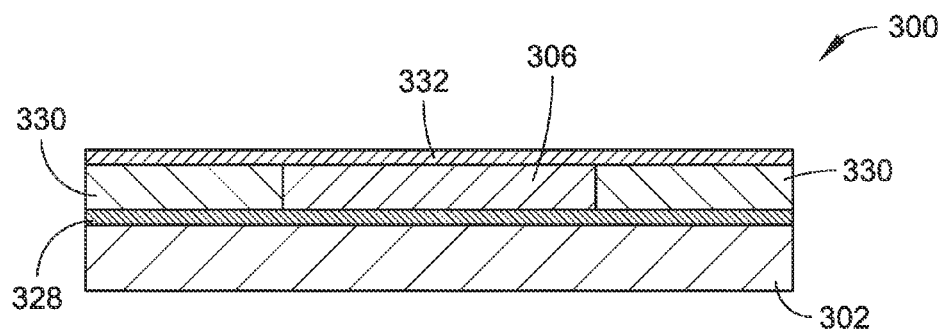
FIG. 3D is a diagrammatic partial cross-sectional side elevation view illustrating the fabrication of a wafer level package, such as the device shown in FIGS. 1A through 1C, in accordance with the process shown in FIG. 2.

A second seed layer is then formed on the first pillar structure and the first mask layer (Block 210). In implementations and as illustrated in FIG. 3D, forming the second seed layer 332 can include forming and/or depositing the second seed layer 332 on the first pillar 306 and the first mask layer 330 similar to the process for forming the first seed layer 328. In some embodiments, the surface of the first pillar 306 and the first mask layer 330 are generally planar. Suitable seed layer forming and/or deposition processes can include physical vapor deposition, chemical vapor deposition, and/or electroplating, etc. In one specific embodiment, forming the second seed layer 332 includes sputtering a layer of copper on the surface of the processed semiconductor wafer 301.

Figure 3E:
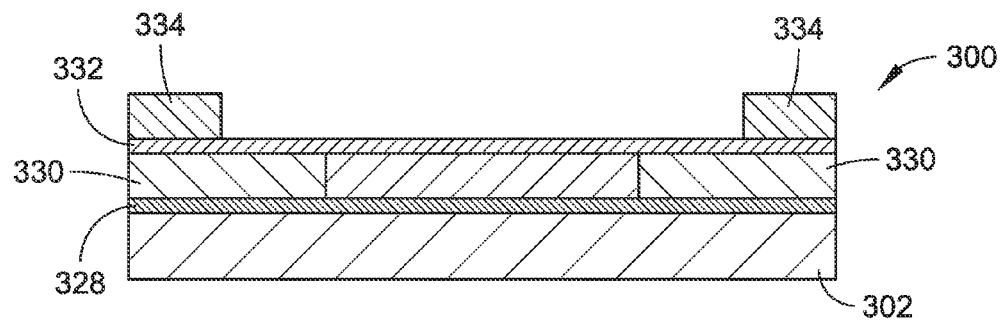
FIG. 3E is a diagrammatic partial cross-sectional side elevation view illustrating the fabrication of a wafer level package, such as the device shown in FIGS. 1A through 1C, in accordance with the process shown in FIG. 2.

Next, a second mask layer is formed on the second seed layer (Block 212). As illustrated in FIG. 3E, the second mask layer 334 can be formed on the second seed layer 312. In implementations, forming the second mask layer 334 may be similar to forming the first mask layer 330, such as using a spin coating process or other deposition techniques, such as chemical vapor deposition. In embodiments, the second mask layer 334 may include a suitable mask material, such as a dielectric (e.g., benzocyclobutene polymer (BCB), Polyimide (PI), Polybenzoxazole (PBO), silicon dioxide (SiO2), etc.), or a nitride mask and so forth. Further, the second mask layer 334 may be selectively etched to at least partially expose at least a portion of the second seed layer 332. In a specific implementation, the second mask layer 334 can be etched to expose an area substantially centered over the first pillar 306 and/or larger than the size of the first pillar 306. Etching the second mask layer 334 in this way con provide a cantilever configuration when the second pillar structure 312 is formed.

Figure 3F:
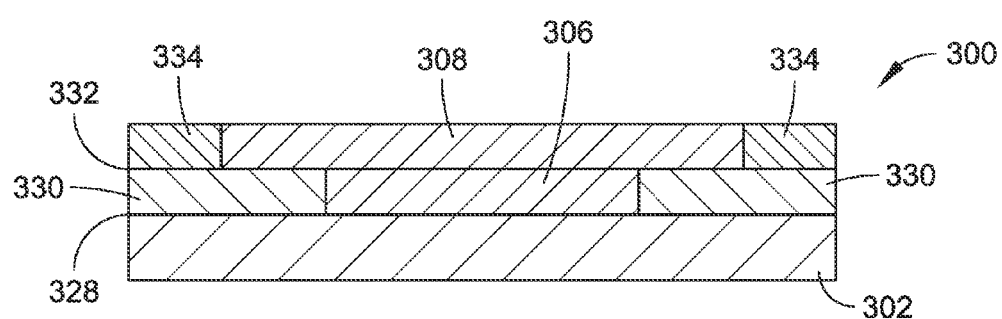
FIG. 3F is a diagrammatic partial cross-sectional side elevation view illustrating the fabrication of a wafer level package, such as the device shown in FIGS. 1A through 1C, in accordance with the process shown in FIG. 2.

Then a second pillar structure is formed on the second seed layer (Block 214). In implementations and as shown in FIG. 3F, forming the second pillar 312 can include depositing the second pillar 312 in the etched portion of the second mask layer 334 and on the second seed layer 332. This provides a second pillar structure 312 such that when combined with the first pillar 306, a cantilevered pillar configuration is formed. The second pillar structure 312 can extend over the first pillar 306 on at least two sides. The second pillar structure 312 can be deposited or formed in a similar fashion to forming the first pillar structure. In one specific implementation, forming the second pillar 312 structure includes electroplating the second seed layer 332 to a desired thickness of copper.

Figure 3G:
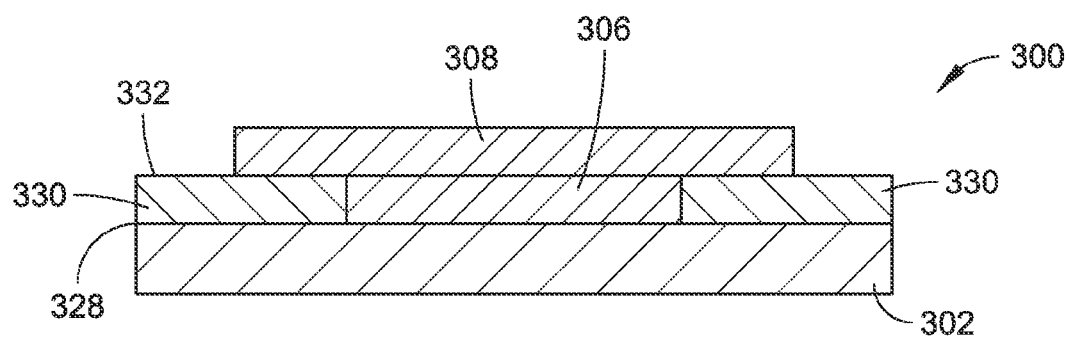
FIG. 3G is a diagrammatic partial cross-sectional side elevation view illustrating the fabrication of a wafer level package, such as the device shown in FIGS. 1A through 1C, in accordance with the process shown in FIG. 2.
Figure 3H:
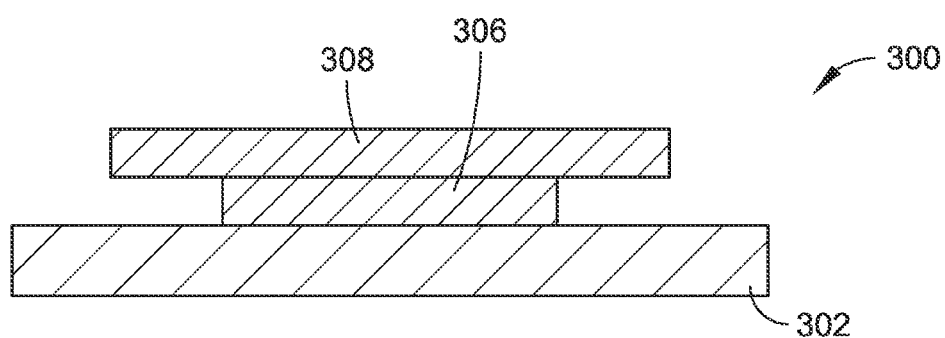
FIG. 3H is a diagrammatic partial cross-sectional side elevation view illustrating the fabrication of a wafer level package, such as the device shown in FIGS. 1A through 1C, in accordance with the process shown in FIG. 2.

Next, the second mask layer is removed (Block 216). In implementations and as shown in FIG. 3G, removing a second mask layer 334 can include using an etchant to remove the second mask layer 334. Additionally, removing the second mask layer 334 can include removing at least a portion of the second seed layer 332. Some suitable etching processes can include plasma etching and/or wet etching, for example. Some examples of etchants that can be used to remove the second mask layer 334 and/or second seed layer 332 can include hydrofluoric acid, aqua regia, nitric acid, hydrochloric acid, etc.

Then, the first mask layer is removed (Block 218). Removing the first mask layer 330 can include using similar etching processes and etchants to those disclosed for removing the second mask layer 334 and/or second seed layer 332. Removing the second mask layer 334, the second seed layer 332, and the first mask layer 330 results in a cantilevered pillar that can provide a greater surface area for solder. Additional processes may be performed, such as forming a passivation layer, forming electrical interconnection (e.g., redistribution layer 114), encapsulating the first pillar structure 306 and the second pillar structure 308 (with a second dielectric layer 112 and/or an encapsulation structure, such as epoxy) to form segment(s) 116, backgrinding the encapsulation structure and/or second dielectric layer 112, forming and/or depositing at least one solder ball 110, reflowing the solder ball 110 to form a solder joint, singulating the wafer level package device 100, and/or coupling the wafer level package device 100 to another electronic component (e.g., electronic device 130, printed circuit board 122, etc.).

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A wafer level package, comprising:
a processed semiconductor wafer including at least one integrated circuit die;
a first dielectric layer disposed on the processed semiconductor wafer;
multiple first pillars formed of a conductive metal disposed on the processed semiconductor wafer, each first pillar coupled to a redistribution layer to form a segment, where multiple segments form a solder joint;

at least one second cantilevered pillar formed on the multiple first corresponding first pillars, the at least one second cantilevered pillar formed of the conductive metal;

a second dielectric layer formed on the first dielectric layer and surrounding a portion of the multiple first pillars and the at least one second cantilevered pillar; and at least one solder ball disposed on the at least one second cantilevered pillar and coupled to the solder joint, where multiple reflowed solder balls are combined to form a solder bar.

2. The wafer level package of claim 1, wherein the processed semiconductor wafer includes at least one contact pad.

3. The wafer level package of claim 1, wherein the first dielectric layer includes polybenzaxazole.

4. The wafer level package of claim 1, wherein the first pillar includes copper.

5. The wafer level package of claim 1, wherein the at least one second cantilevered pillar includes three second cantilevered pillars formed on the first pillar where the three second cantilevered pillars form three segments.

6. The wafer level package of claim 1, wherein the at least one second cantilevered pillar includes copper.

7. The wafer level package of claim 1, wherein the at least one second cantilevered pillar is in a two-side cantilever configuration.

8. The wafer level package of claim 1, wherein the at least one second cantilevered pillar and the multiple first pillars are disposed directly between the processed semiconductor wafer and the at least one solder ball.

9. The wafer level package of claim 1, wherein the at least one solder ball includes LF35 solder.

10. The wafer level package of claim 1, wherein the at least one second cantilevered pillar forms a standoff solder joint.

11. The wafer level package of claim 10, wherein the at least one second cantilevered pillar forms a standoff solder joint with a standoff height of about 200 μm.

12. An electronic device, comprising:
a printed circuit board; and
a wafer level package coupled to the printed circuit board, the wafer level package including a processed semiconductor wafer including at least one integrated circuit die;

a first dielectric layer disposed on the processed semiconductor wafer;

multiple first pillars formed of a conductive metal disposed on the processed semiconductor wafer, each first pillar coupled to a redistribution layer to form a segment, where multiple segments form a solder joint;

at least one second cantilevered pillar formed on the multiple first pillars, the at least one second cantilevered pillar formed of the conductive metal, where each second cantilevered pillar overlaps at least one edge of each corresponding first pillar;

a second dielectric layer formed on the first dielectric layer and surrounding a portion of the multiple first pillars and the at least one second cantilevered pillar; and at least one solder ball disposed on the at least one second cantilevered pillar and coupled to the solder joint, where multiple reflowed solder balls are combined to form a solder bar.

13. The electronic device of claim 12, wherein the at least one second cantilevered pillar forms a standoff solder joint with a standoff height of about 200 μm.

14. The electronic device of claim 12, wherein the at least one second cantilevered pillar includes three second cantilevered pillars formed on the first pillar where the three second cantilevered pillars form three segments.

15. The electronic device of claim 12, wherein the at least one solder ball includes LF35 solder.

16. The electronic device of claim 12, wherein a first array of solder bars comprises power connections and a second array of solder bars comprises control pins.

17. The wafer level package of claim 1, wherein the at least one second cantilevered pillar formed on the multiple first pillars includes a continuous flat surface that is distal from the processed semiconductor wafer and couples to the at least one solder ball.

* * * * *